(12) United States Patent
Freitag et al.

(10) Patent No.: US 7,268,985 B2
(45) Date of Patent: Sep. 11, 2007

(54) MAGNETIC HEAD HAVING A LAYERED HARD BIAS LAYER EXHIBITING REDUCED NOISE

(75) Inventors: James Mac Freitag, San Jose, CA (US); James L. Nix, Gilroy, CA (US); Mustafa Michael Pinarbasi, Morgan Hill, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 502 days.

(21) Appl. No.: 10/856,710

(22) Filed: May 28, 2004

(65) Prior Publication Data

US 2005/0264955 A1    Dec. 1, 2005

(51) Int. Cl.
    G11B 5/39    (2006.01)
    G11B 5/33    (2006.01)
(52) U.S. Cl. .................................. 360/324.12
(58) Field of Classification Search ............... 360/324, 360/324.1, 324.12, 324.2, 327.3, 327.32
    See application file for complete search history.

(56) References Cited

U.S. PATENT DOCUMENTS

| | | | | |
|---|---|---|---|---|
| 5,005,096 A * | 4/1991 | Krounbi et al. | ........ | 360/327.31 |
| 5,434,826 A | 7/1995 | Ravipati et al. | ............ | 367/140 |
| 5,461,527 A | 10/1995 | Akiyama et al. | ........... | 360/113 |
| 5,739,987 A | 4/1998 | Yuan et al. | .................. | 360/113 |
| 5,742,162 A | 4/1998 | Nepela et al. | ............... | 324/252 |
| 6,111,730 A * | 8/2000 | Fernandez-de-Castro | | 360/327.1 |
| 6,118,624 A | 9/2000 | Fukuzawa et al. | .......... | 360/113 |
| 6,144,534 A | 11/2000 | Xue et al. | ............... | 360/327.32 |
| 6,266,218 B1 * | 7/2001 | Carey et al. | ........... | 360/324.12 |
| 6,574,080 B1 | 6/2003 | Sakaguci et al. | ....... | 360/327.32 |
| 6,760,966 B2 * | 7/2004 | Wang et al. | ............. | 29/603.14 |
| 6,822,836 B2 * | 11/2004 | Gill | ........................ | 360/324.12 |
| 6,903,906 B2 * | 6/2005 | Morinaga et al. | ....... | 360/324.12 |
| 7,016,164 B2 * | 3/2006 | Gill | ........................ | 360/324.11 |
| 7,061,731 B2 * | 6/2006 | Larson et al. | .......... | 360/324.12 |
| 7,072,156 B2 * | 7/2006 | Cyrille et al. | ............. | 360/327.3 |
| 2001/0028540 A1 | 10/2001 | Sakaguci et al. | ....... | 360/324.12 |
| 2003/0039083 A1 | 2/2003 | Seyama et al. | ........ | 360/324.12 |
| 2003/0133233 A1 | 7/2003 | Gill | ........................ | 360/324.12 |

FOREIGN PATENT DOCUMENTS

| JP | 7210828 | 8/1995 |
|---|---|---|
| JP | 9128713 | 5/1997 |
| JP | 2002359414 | 12/2002 |

* cited by examiner

*Primary Examiner*—Angel Castro
(74) *Attorney, Agent, or Firm*—Robert O. Guillot; Intellectual Property Law Offices

(57) ABSTRACT

A magnetic head having an improved read head structure. The read head includes a free magnetic layer with hard bias elements disposed proximate its ends, where the hard bias elements include an improved hard bias magnetic grain structure. This is accomplished by fabricating the hard bias element as a bilayer structure having a first hard bias sublayer, a nonmagnetic midlayer and a second hard bias sublayer. The midlayer is preferably composed of a nonmagnetic material such as chromium, and the hard bias sublayers are composed of a magnetic material such as CoPtCr. Each sublayer is formed with its own magnetic grains, and because there are two sublayers, the hard bias element is fabricated with approximately twice the number of magnetic grains as the prior art single layer hard bias element.

23 Claims, 4 Drawing Sheets

| HARD BIAS LAYERS | PRIOR ART | 3Å Cr MIDLAYER | 5Å Cr MIDLAYER | 10Å Cr MIDLAYER |
|---|---|---|---|---|
| Rh | 30Å | 30Å | 30Å | 30Å |
| CoPtCr | - | 87.5Å | 87.5Å | 87.5Å |
| Cr | - | 3Å | 5Å | 10Å |
| CoPtCr | CoPtCr-175Å | 87.5Å | 87.5Å | 87.5Å |
| Cr | Cr-100Å | 100Å | 100Å | 100Å |
| Coercivity (Oe) | 1550 | 1490 | 1517 | 1493 |
| Sq. | 0.94 | 0.939 | 0.926 | 0.959 |
| Ms | 3.58 | 3.55 | 3.49 | 3.4 |

Fig. 9

MAGNETIC HEAD HAVING A LAYERED HARD BIAS LAYER EXHIBITING REDUCED NOISE

BACKGROUND OF THE INVENTION

1. Field of the Invention

The present invention relates generally to read heads for use in magnetic heads for hard disk drives, and more particularly to a read head which includes a multi-layer magnetic hard bias element.

2. Description of the Prior Art

Magnetic heads for hard disk drives typically include a read head portion and a write head portion. In a commonly used read head, a magnetoresistive read sensor layered structure is located in a read region, while a magnetic hard bias element and an electrical lead element are located in each of two side regions. The sensor typically comprises an antiferromagnetic pinning layer, a pinned magnetic layer, a nonmagnetic spacer layer, a free magnetic layer, and a nonmagnetic cap layer. The hard bias element typically comprises a nonmagnetic seed layer and a hard-magnetic biasing layer.

In such magnetic heads the free magnetic layer is fabricated such that its magnetization is free to rotate in response to an external magnetic field. Passing magnetic data bits on the magnetic disk of the hard disk drive cause rotation of the magnetization of the free magnetic layer which creates a change in the electrical resistance of the sensor, and an electrical sense current that passes through the free magnetic layer is correspondingly altered by the altering resistance of the free magnetic layer. The hard bias element provides a biasing magnetic field for stabilizing the magnetic field of the free magnetic layer, and in order to function properly the magnetic field of the hard bias element is formed from a high coercivity material where its magnetization is oriented in the track width direction of the read head.

In modern magnetic heads, the size of the magnetoresistive sensor is constantly being reduced to read ever smaller data bits on hard disks having greater areal data storage density. The size of the hard bias elements is likewise reduced. This can create difficulty in fabricating the necessary hard bias magnetic field, as the number of magnetic grains within the hard bias layer material are reduced where its size is reduced.

The problem in current magnetic heads is that the size of the hard bias elements is being reduced to the point that fewer than ten hard bias grains exist at the junction with the free magnetic layer. As a result, an off-axis orientation of the magnetic field of just one or two magnetic grains within the hard bias element can significantly impact the uniformity of the hard bias magnetic field, and this results in the creation of noise in the magnetic head signal. The present invention seeks to solve this problem by creating more magnetic grains within the hard bias element to create a more uniform biasing magnetic field for the free magnetic layer.

SUMMARY OF THE INVENTION

The hard disk drive of the present invention includes the magnetic head of the present invention having an improved read head portion. The improved read head includes a free magnetic layer with hard bias elements disposed proximate its ends, where the hard bias elements include an improved hard bias magnetic grain structure. The improved magnetic grain structure is formed by essentially doubling the number of magnetic grains. This is accomplished by fabricating the hard bias element in a bilayer structure, having a first hard bias sublayer, a nonmagnetic midlayer and a second hard bias sublayer. The midlayer is preferably composed of a nonmagnetic material such as chromium, and the hard bias sublayers are composed of a magnetic material such as CoPtCr. By way of comparison, in a typical prior art single layer hard bias element, the magnetic grains extend throughout the thickness of the hard bias element, whereas, in the bilayer hard bias element of the present invention, each sublayer is formed with its own magnetic grains which extend through the thickness of these sublayers, and because there are two sublayers, the hard bias element is advantageously fabricated with approximately twice the number of magnetic grains as the prior art single layer hard bias element.

Where the prior art hard bias element includes generally less than ten magnetic grains near the junction with the free magnetic layer, an unwanted, off-axis orientation of the hard bias magnetic field within even one or two magnetic grains creates a statistically significant off-axis magnetic field that contributes to noise in the read head signal. Where the number of magnetic grains is increased, such as in the present invention, the occurrence of one or two magnetic grains having the unwanted off-axis orientation is statistically diminished, and the noise that is created by off-axis magnetic field orientation of some magnetic grain components of the overall hard bias magnetic field is reduced.

It is an advantage of the magnetic head of the present invention that it has a read head sensor having reduced signal noise.

It is another advantage of the magnetic head of the present invention that it has a read head sensor with improved hard biasing of the free magnetic layer.

It is a further advantage of the magnetic head of the present invention that it includes a read head sensor having a hard bias element with more magnetic grains located proximate the junction with the free magnetic layer.

It is yet another advantage of the magnetic head of the present invention that it includes a read head sensor having a bilayer hard bias element, such that approximately twice the number of magnetic grains are created within it.

It is an advantage of the hard disk drive of the present invention that it includes a magnetic head of the present invention which has a read head sensor having reduced signal noise.

It is another advantage of the hard disk drive of the present invention that it includes a magnetic head of the present invention that it has a read head sensor with improved hard biasing of the free magnetic layer.

It is a further advantage of the hard disk drive of the present invention that it includes a magnetic head of the present invention that it includes a read head sensor having a hard bias element with more magnetic grains located proximate the junction with the free magnetic layer.

It is yet another advantage of the hard disk drive of the present invention that it includes a magnetic head of the present invention that it includes a read head sensor having a bilayer hard bias element, such that approximately twice the number of magnetic grains are created within it.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

FIG. 9 is a table that provides significant operational parameters for three alternative multilayer hard bias elements of the present invention.

DETAILED DESCRIPTION OF THE PREFERRED EMBODIMENTS

Figure 1:
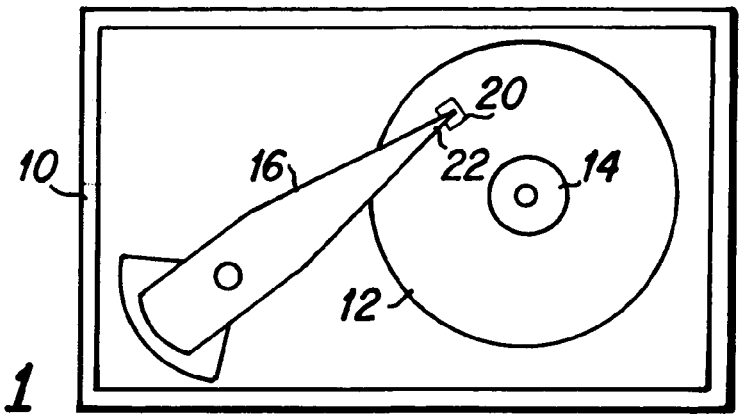
FIG. 1 is a top plan view generally depicting a hard disk drive of the present invention that includes a magnetic head of the present invention.

FIG. 1 is a top plan view that depicts significant components of a hard disk drive which includes the magnetic head of the present invention. The hard disk drive 10 includes a magnetic media hard disk 12 that is rotatably mounted upon a motorized spindle 14. An actuator arm 16 is pivotally mounted within the hard disk drive 10 with a magnetic head 20 of the present invention disposed upon a distal end 22 of the actuator arm 16. A typical hard disk drive 10 may include a plurality of disks 12 that are rotatably mounted upon the spindle 14 and a plurality of actuator arms 16 having a magnetic head 20 mounted upon the distal end 22 of the actuator arms. As is well known to those skilled in the art, when the hard disk drive 10 is operated, the hard disk 12 rotates upon the spindle 14 and the magnetic head 20 acts as an air bearing slider that is adapted for flying above the surface of the rotating disk. The slider includes a substrate base upon which the various layers and structures that form the magnetic head are fabricated. Such heads are fabricated in large quantities upon a wafer substrate and subsequently sliced into discrete magnetic heads 20.

Figure 2:
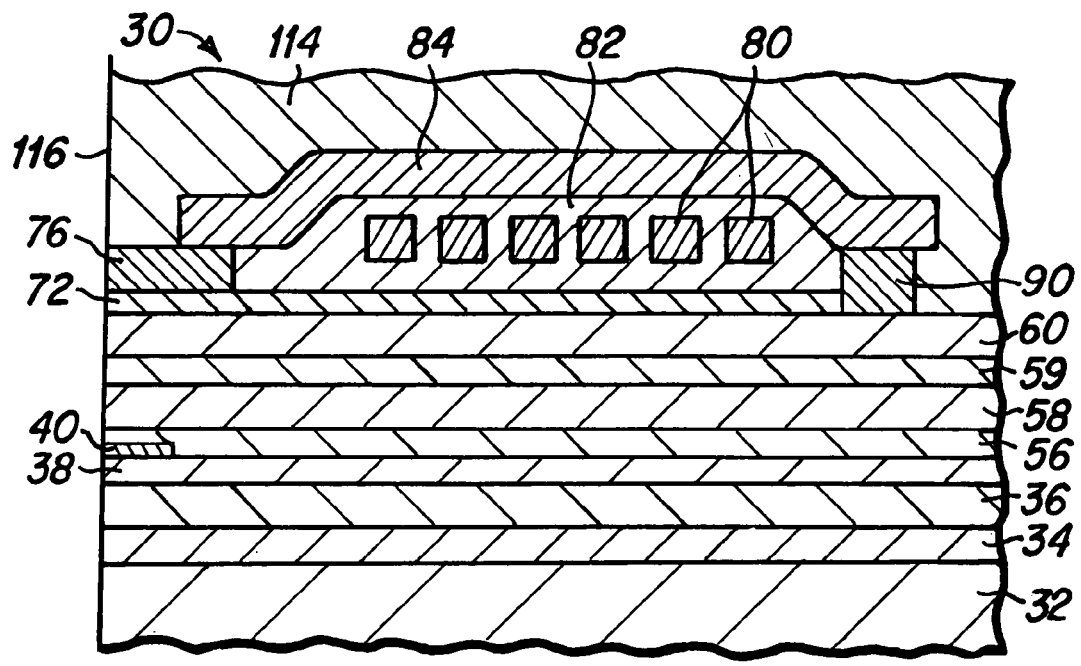
FIG. 2 is a side cross-sectional view depicting a typical prior art magnetic head.
Figure 3:
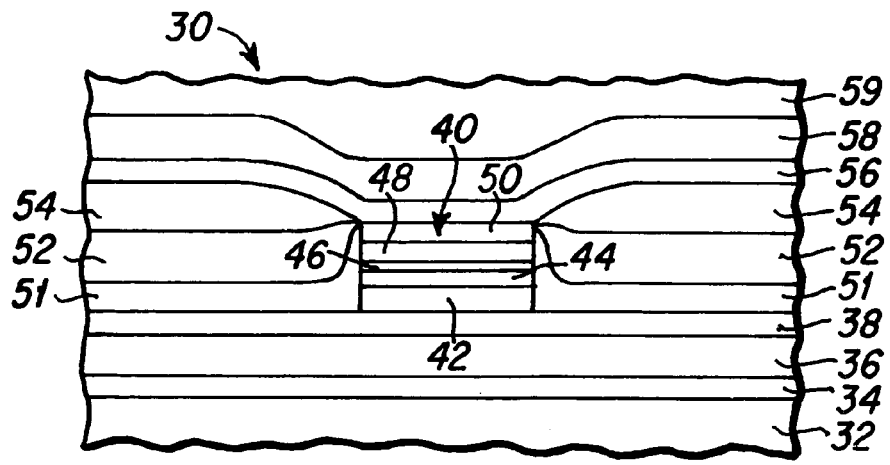
FIG. 3 is an elevational view taken from the air bearing surface of the read head portion of the magnetic head depicted in FIG. 2.

A typical prior art magnetic head structure is next described with the aid of FIGS. 2-5 to provide a basis for understanding the improvements of the present invention. As will be understood by those skilled in the art, FIG. 2 is a side cross-sectional view that depicts portions of a prior art magnetic head 30, termed a longitudinal magnetic head, and FIG. 3 is an elevational view of the read head portion of the magnetic head depicted in FIG. 2, taken from the air bearing surface of FIG. 2.

As depicted in FIGS. 2 and 3, a typical prior art magnetic head 30 includes a substrate base 32 with an insulation layer 34 formed thereon. A first magnetic shield (S1) 36 is fabricated upon the insulation layer and a first insulation layer (G1) 38 of the read head is fabricated upon the S1 magnetic shield 36. A magnetoresistive sensor 40, comprising a plurality of layers of specifically chosen materials, is then fabricated upon the G1 layer 38. As is best seen in FIG. 3, the magnetoresistive sensor 40 includes a pinning layer 42 that is typically composed of PtMn having a thickness of approximately 150 Å, a pinned magnetic layer 44 that may include sublayers of CoFe, Ru and CoFe, having thicknesses of approximately 16 Å, 8 Å and 18 Å respectively. Thereafter, a spacer layer 46, typically composed of Cu or CuO having a thickness of approximately 20 Å is deposited upon the pinned layer 44. A free magnetic layer 48, typically composed of CoFe and NiFe, and having a thickness of approximately 30 Å is next deposited upon the spacer layer 46, and a cap layer 50, typically composed of tantalum and having a thickness of approximately 40 Å is deposited upon the free magnetic layer 48. Outer sections of the MR sensor layers are removed, typically by ion milling, and a hard bias element is deposited on each side of the remaining MR sensor layers 40. The hard bias element typically includes a Cr seed layer 51, having a thickness of approximately 100 Å, and a hard bias magnetic layer 52 typically comprised of CoPtCr and having a thickness of approximately 200 Å. Thereafter, electrical leads 54 are fabricated upon the hard bias layer 52 and a second insulation layer (G2) 56 is subsequently deposited across the top of the device. Thereafter, a second magnetic shield (S2) 58 is fabricated upon the G2 layer.

Returning to FIG. 2, an electrical insulation layer 59 is then deposited upon the S2 shield 58, and a first magnetic pole (P1) 60 is fabricated upon the insulation layer 59. Following the fabrication of the P1 pole 60, a write gap layer typically composed of a non-magnetic material such as alumina 72 is deposited upon the P1 pole 60. This is followed by the fabrication of a P2 magnetic pole tip 76 and an induction coil structure, including coil turns 80, that is then fabricated within insulation 82 above the write gap layer 72. Thereafter, a yoke portion 84 of the second magnetic pole is fabricated in magnetic connection with the P2 pole tip 76, and through back gap element 90 to the P1 pole 60. Electrical leads (not shown) to the induction coil are subsequently fabricated and a further insulation layer 114 is deposited to encapsulate the magnetic head. The magnetic head 30 is subsequently fabricated such that an air bearing surface (ABS) 116 is created.

It is to be understood that there are many detailed features and fabrication steps of the magnetic head 30 that are well known to those skilled in the art, and which are not deemed necessary to describe herein in order to provide a full understanding of the present invention.

Figure 4:
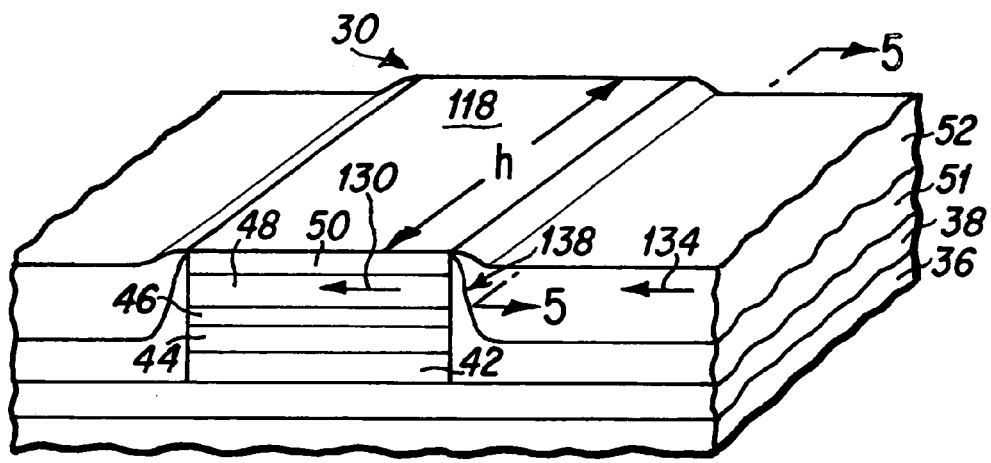
FIG. 4 is a perspective view of a portion of the prior art read head depicted in FIGS. 2 and 3.
Figure 5:
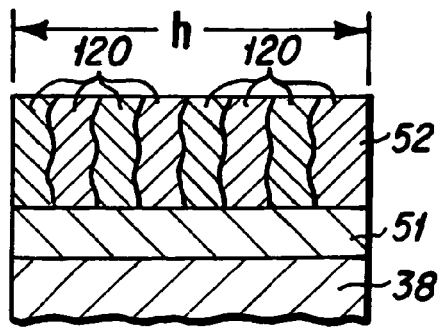
FIG. 5 is a cross-sectional view of the hard bias layer of the prior art read head taken proximate the junction of the hard bias layer with the MR sensor layers, along lines 5-5 of FIG. 4.

FIG. 4 is a perspective view of a portion of the prior art read head depicted in FIG. 3, and FIG. 5 is a cross-sectional view of the hard bias layer structure, taken generally along lines 5-5 of FIG. 4. The prior art read head, as depicted in the perspective view of FIG. 4 shows the top surface 118 of the tantalum cap 50 and the hard bias layer 52, where the stripe height h is shown. A typical stripe height is approximately 600 Å, where the thickness of the hard bias layer 52 is approximately 200 Å. It is typical that a hard bias layer will be fabricated on a chromium seed layer 51 such that a plurality of magnetic grains are created having a grain size of approximately 60 to 100 Å, and a hard bias layer 52 having magnetic grains 120 is depicted in the cross-sectional view of FIG. 5. As can be seen in FIG. 5, there will be approximately 7 or 8 such magnetic grains 120 formed across the 600 Å stripe height of the hard bias layer 52, where each of the grains 120 typically extends throughout the thickness of the hard bias layer 52.

In an MR read head, as is depicted in FIG. 4, the nominal direction of the magnetization of the free magnetic layer 48 is in the plane of the free magnetic layer (see arrow 130) in the direction of the track width, and the hard bias layers 52 are desirably fabricated such that the magnetic field direction of each of the magnetic grains 120 is also in the plane of the free magnetic layer 48 (see arrows 134) in the direction of the track width. As is well known to those skilled in the art, it is the purpose of the hard bias layers 52 to have a fixed (hard) biasing magnetic field in the direction of arrows 134 for the specific purpose of biasing the magnetic field direction 130 of the free magnetic layer 48.

A problem that exists with the prior art magnetic heads 30, as depicted in FIGS. 2-5 is that the biasing magnetic field direction of each of the magnetic grains 120 within the hard bias layer is not always in the direction of arrows 134. Increased signal noise can result from an undesirable, off-axis, magnetic field direction of one or more of the magnetic grains 120 within the hard bias layer 52. This problem becomes more significant in advanced magnetic head designs where the size of the read head structures is decreased in order to read smaller data bits that are formed on magnetic disks having increased areal data storage density. Particularly, with reference to FIG. 5, where there are as few of seven or eight magnetic grains 120 in the hard bias layer 52 that are located proximate junction 138 with the free magnetic layer 48, where one or two of these magnetic grains has an undesirable off-axis magnetic field direction, this represents a relatively high percentage of the magnetic grains and the signal noise that is thereby created can be significant. The present invention addresses this problem.

Figure 6:
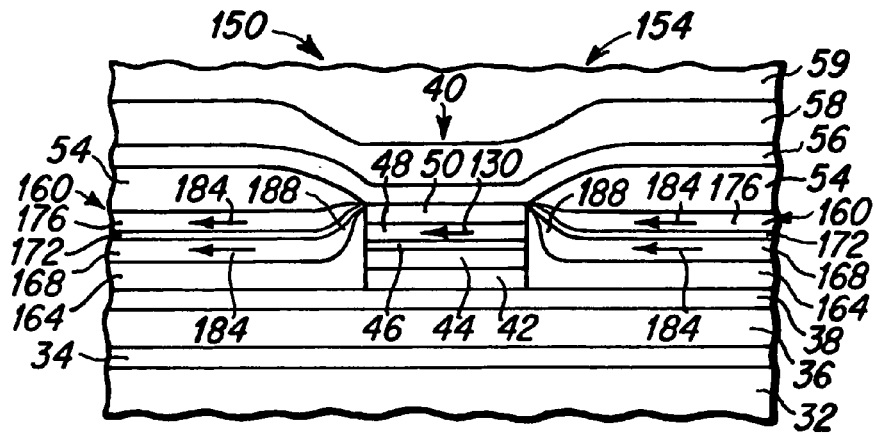
FIG. 6 is an elevational view taken from the air bearing surface of a read head portion of a magnetic head of the present invention.
Figure 7:
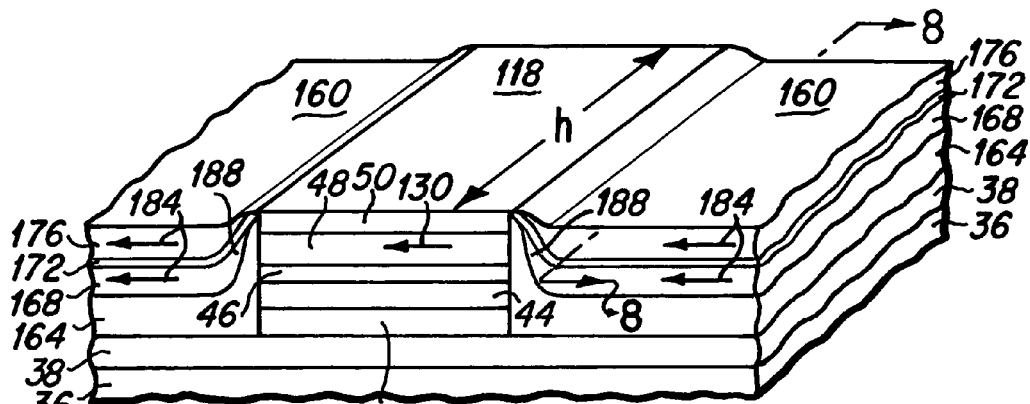
FIG. 7 is a perspective view of a portion of the read head depicted in FIG. 6.
Figure 8:
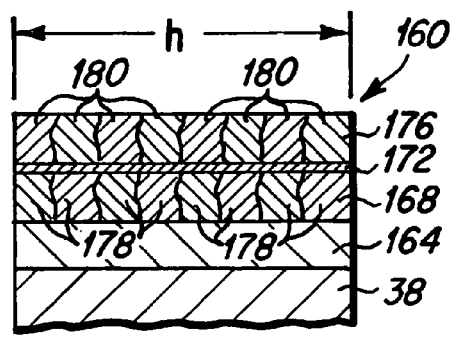
FIG. 8 is a cross-sectional view of the hard bias layer of the present invention taken proximate the junction of the hard bias layer with the MR sensor layers, along lines 8-8 of FIG. 7.

FIGS. 6, 7 and 8 depict features of the read head portion 150 of a magnetic head 154 of the present invention, wherein FIG. 6 is an elevational view taken from the air bearing surface (similar to the direction of FIG. 3), FIG. 7 is a perspective view depicting a portion of the read head of the present invention (similar to FIG. 4), and FIG. 8 is a cross-sectional view taken along lines 8-8 of FIG. 7 (similar to the direction of FIG. 5). As will be understood from the following description, the significant differences between the magnetic head 154 of the present invention and the prior art magnetic head 30 depicted in FIGS. 2-5 relates to the structure of the hard bias layer; other features and structures of the magnetic head 154 of the present invention may be similar to those of the prior art magnetic head 30, and similar structures are numbered identically for ease of understanding.

As depicted in FIGS. 6 and 7, the read head structure 150 of the magnetic head 154 of the present invention includes a substrate base 32 with an insulation layer 34 formed thereon. A first magnetic shield (S1) 36 is fabricated upon the insulation layer and a first insulation layer (G1) 38 of the read head is fabricated upon the S1 magnetic shield 36. A magnetoresistive sensor 40, comprising a plurality of layers of specifically chosen materials, is then fabricated upon the G1 layer 38. As is best seen in FIG. 6, the magnetoresistive sensor 40 includes a pinning layer 42 that is typically composed of PtMn having a thickness of approximately 150 Å, a pinned magnetic layer 44 that may include sublayers of CoFe, Ru and CoFe, having thicknesses of approximately 16 Å, 8 Å and 18 Å respectively. Thereafter, a spacer layer 46, typically composed of Cu or CuO having a thickness of approximately 20 Å is deposited upon the pinned layer 44. A free magnetic layer 48, typically composed of CoFe and NiFe, and having a thickness of approximately 30 Å is next deposited upon the spacer layer 46, and a cap layer 50, typically composed of tantalum and having a thickness of approximately 40 Å is deposited upon the free magnetic layer 48. Outer sections of the MR sensor layers are removed, typically by ion milling, and a hard bias element is fabricated on each side of the remaining MR sensor layers 40.

The hard bias element 160 of the magnetic head of the present invention includes a Cr seed layer 164, having a thickness of approximately 100 Å to approximately 350 Å, and first a hard bias magnetic sublayer 168 typically comprised of CoPtCr that is fabricated upon the seed layer 164 and having a thickness that may be approximately one-half of the thickness of the prior art magnetic bias layer 52, such that the thickness of the first sublayer 168 is approximately 100 Å. Thereafter, a thin midlayer 172 that is comprised of a nonmagnetic material, such as chromium, is deposited to a thickness of approximately 3 Å to approximately 10 Å. Thereafter, a second hard bias sublayer 176 is fabricated upon the midlayer 172. The second hard bias sublayer 176 may have a thickness that is approximately equal to the thickness of the first sublayer 168, which may be approximately 100 Å. It can therefore be seen that the hard bias layer 160 of the read head of the magnetic head 154 of the present invention may have a total thickness (203 Å to 210 Å) that is approximately equal to the thickness (200 Å) of the hard bias layer 52 of the prior art magnetic head, where the hard bias layer 160 is comprised of two sublayers 168 and 176 that are separated by a thin nonmagnetic midlayer 172. Thereafter, electrical leads 54 are fabricated upon the upper hard bias sublayer 176, and a second insulation layer (G2) 56 is subsequently deposited across the top of the device. Thereafter, a second magnetic shield (S2) 58 is fabricated upon the G2 layer.

A magnetic head 154 of the present invention may include a write head portion that is substantially similar to the write head depicted in FIG. 2. However, the magnetic head of the present invention is not to be so limited, and may include virtually any type of write head structure that may be fabricated upon the read head depicted and described in FIGS. 6, 7 and 8. With regard to the magnetic head of the present invention, and with reference to FIG. 2 as an illustrative example, an electrical insulation layer 59 is then deposited upon the S2 shield 48, and a first magnetic pole (P1) 60 is fabricated upon the insulation layer 59. Following the fabrication of the P1 pole 60, a write gap layer typically composed of a non-magnetic, non-conductive, non-metallic material such as alumina 72 is deposited upon the P1 pole 60. This is followed by the fabrication of a P2 magnetic pole tip 76 and an induction coil structure, including coil turns 80 that is then fabricated within insulation 82 above the write gap layer 72. Thereafter, a yoke portion 84 of the second magnetic pole is fabricated in magnetic connection with the P2 pole tip 76, and through back gap element 90 to the P1 pole 60. Electrical leads (not shown) to the induction coil are subsequently fabricated and a further insulation layer 114 is deposited to encapsulate the magnetic head. The magnetic head 38 is subsequently fabricated such that an air bearing surface (ABS) 116 is created.

As with the description of the prior art magnetic head 30 hereabove, there are many detailed features and fabrication steps of the magnetic head 154 that are well known to those skilled in the art, and which are not deemed necessary to describe herein in order to provide a full understanding of the present invention.

FIG. 7 is a perspective view of a portion of the read head 150 of the present invention depicted in FIG. 6, and FIG. 8 is a cross-sectional view of the hard bias layer structure 160, taken generally along lines 8-8 of FIG. 7. The read head of the present invention, as depicted in the perspective view of FIG. 7 shows the top surface 118 of the tantalum cap 50 and the hard bias layer structure 160, where the stripe height h is shown. A typical stripe height is approximately 600 Å, where the thickness of the hard bias layer 160 is approximately 200 Å. The first hard bias sublayer 168 is fabricated on a chromium seed layer 164 such that a plurality of magnetic grains 178 are created in the sublayer 168 having a grain size of approximately 60 to 100 Å, and such magnetic grains 178 are depicted in the cross-sectional view of FIG. 8. As can be seen in FIG. 8, there will be approximately 7 or 8 such magnetic grains 178 formed across the 600 Å stripe height of the first hard bias sublayer 168, where each of the grains 178 typically extends throughout the thickness of the hard bias sublayer 168. In the second hard bias sublayer 176 a second set of approximately 7 or 8 magnetic grains 180 is formed across its 600 Å stripe height, where each of the grains 180 typically extends throughout the thickness of the hard bias sublayer 176. The magnetic grains 178 and 180 in the two sublayers 168 and 176 respectively are separated by the midlayer 172, however it is typical that the magnetic grains 180 in the second sublayer 176 will generally be affected by the magnetic field of the magnetic grains 178 previously created in the first sublayer 168, such that the magnetic grains 180 in the second sublayer 176 will generally be aligned with the magnetic grains 178 in the first sublayer 168.

In an MR read head, as is depicted in FIG. 7, the nominal direction of the magnetization of the free magnetic layer 48 is in the plane of the free magnetic layer (see arrow 130), and the hard bias sublayers 168 and 176 are desirably fabricated such that the magnetic field direction (see arrows 184) of each of the magnetic grains 178 and 180 is also in the direction 130 of the plane of the free magnetic layer. As with the prior art read head described above, it is the purpose of the hard bias layers to have a fixed (hard) bias magnetic field in the direction of arrows 184 for the specific purpose of biasing the magnetic field direction 130 of the free magnetic layer 48. In order to function properly the hard bias sublayers are preferably formed with a well textured HCT (hexagonal close packed) crystalline structure having an in-plane C axis orientation. They are formed with a high coercivity material so that magnetic fields from the data bits on the disk will not rotate the magnetization of the hard bias grains, where the magnetization of the grains is in the plane of the free magnetic layer in the track width direction.

As is best seen in the cross-sectional view of FIG. 8, the thin film Cr midlayer 172 effectively divides the hard bias layer into two sublayers 168 and 176, where each sublayer will have approximately the same 7 to 8 magnetic grains formed across the 600 Å stripe height of each sublayer. As a result, where each sublayer is formed with approximately 7-8 magnetic grains, the number of magnetic grains (178 plus 180) that exist proximate the junction 188 of the hard bias layer 160 with the free magnetic layer 48 is approximately double that of the prior art design due to the midlayer 172. Because the hard bias layer 160 of the magnetic head 154 of the present invention includes approximately twice the number of magnetic grains as the prior art hard bias layer 52, there is a greater likelihood that a higher percentage of the magnetic grains will form with magnetic fields in the desired direction. Test results, as next described, have shown that the multilayer hard bias element 160 of the present invention has generally the equivalent desirable magnetic properties as the prior art single layer hard bias element 52 where it has approximately the same thickness, however the signal noise of the magnetic head 154 of the present invention is reduced.

FIG. 9 is a table that compares the significant magnetic properties of a prior art single hard bias layer with three different multilayer hard bias layers of the present invention, wherein the thickness of a chromium midlayer 172 is 3 Å, 5 Å and 10 Å. As can be seen from FIG. 9, the prior art hard bias layer structure includes a 100 Å chromium seed layer and a hard bias layer comprised of CoPtCr having a thickness of 175 Å, with a 30 Å rhodium layer (similar to the composition of an electrical lead layer 54) disposed thereon. The three exemplary hard bias element structures of the present invention each includes an identical chromium seed layer of 100 Å, with a hard bias layer 160 that is divided into two 87.5 Å sublayer halves (half of the 175 Å thick hard bias layer of the prior art) separated by a chromium midlayer of 3 Å, 5 Å and 10 Å (in each of the three examples). It can be seen that the coercivity, squareness and magnetostriction (MS) of the three examples of the present invention are nearly identical (within a few percent) of the prior art device.

With regard to noise reduction, with a typical read head signal of approximately 900 to 1,100 micro volts, the read head of the present invention has shown a noise reduction of approximately 20% at 50 megahertz over the prior art magnetic head.

The present invention is not to be limited to the materials described hereabove in the preferred embodiments. That is, the hard bias sublayers 168 and 176 may be comprised of materials other than CoPtCr, such as CoPtCrTa or other known hard bias materials, and the midlayer 172 may be comprised of non-magnetic materials other than Cr, such as Ta. Additionally, the present invention is not to be limited to a hard bias element having only two sublayers with a midlayer therebetween. Rather, a hard bias element having three, four or more sublayers with thin midlayers therebetween is contemplated.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

We claim:

1. A magnetic head comprising:
   a read sensor including a free magnetic layer;
   a hard bias element being disposed at a side edge of said free magnetic layer;
   said hard bias element including at least two sublayers, and having a midlayer being disposed between each said sublayer, and wherein each said sublayer is formed with magnetic grains having a thickness that is equal to a thickness of the sublayer in which the magnetic grains are located.

2. A magnetic head as described in claim 1 wherein said midlayer is comprised of a nonmagnetic material, and each said sublayer is comprised of a magnetic material.

3. A magnetic head as described in claim 2 wherein said midlayer is comprised of Cr or Ta.

4. A magnetic head as described in claim 2 wherein each said sublayer is comprised of CoPtCr or CoPtCrTa.

5. A magnetic head as described in claim 1 wherein a first said sublayer is disposed upon a seed layer.

6. A magnetic head as described in claim 5 wherein said seed layer is composed of Cr.

7. A magnetic head as described in claim 1 wherein each said sublayer is formed with magnetic grains that extend through a thickness of said sublayer.

8. A magnetic head as described in claim 1 wherein each said sublayer is formed with a substantially equal thickness.

9. A magnetic head comprising:
a bottom magnetic shield layer ($S_1$);
a bottom insulation layer ($G_1$);
an antiferromagnetic pinning layer being fabricated above said bottom insulation layer;
pinned layers being fabricated above said antiferromagnetic pinning layer;
a spacer layer being fabricated above said pinned layers;
a free magnetic layer being fabricated above said spacer layer;
a cap layer being fabricated above said free magnetic layer;
a top insulation layer ($G_2$) being fabricated above said cap layer;
a top magnetic shield layer ($S_2$) being fabricated above said $G_2$ layer;
a hard bias structure being fabricated above portions of said bottom insulation layer, said hard bias structure comprising a seed layer and a hard bias element, and wherein said hard bias element includes a first hard bias sublayer, a nonmagnetic midlayer, and a second hard bias sublayer, and wherein each said sublayer is formed with magnetic grains having a thickness that is equal to a thickness of the sublayer in which the magnetic grains are located.

10. A magnetic head as described in claim 9 wherein said midlayer is comprised of a nonmagnetic material, and each said sublayer is comprised of a magnetic material.

11. A magnetic head as described in claim 10 wherein said midlayer is comprised of Cr or Ca.

12. A magnetic head as described in claim 10 wherein each said sublayer is comprised of CoPtCr or CoPtCrTa.

13. A magnetic head as described in claim 9 wherein a first said sublayer is disposed upon a seed layer.

14. A magnetic head as described in claim 13 wherein said seed layer is composed of Cr.

15. A magnetic head as described in claim 9 wherein said free magnetic layer is formed with two end regions, and a hard bias structure is disposed at each said end region of said free magnetic layer.

16. A magnetic head as described in claim 9 wherein each said sublayer is formed with a substantially equal thickness.

17. A hard disk drive, comprising:
a motor for rotating a spindle;
a thin film magnetic disk being mounted on said spindle;
an actuator assembly having a magnetic head mounted thereon, wherein said magnetic head includes:
a read sensor including a free magnetic layer;
a hard bias element being disposed at a side edge of said free magnetic layer;
said hard bias element including at least two sublayers, and having a midlayer being disposed between said sublayers, and wherein each said sublayer is formed with magnetic grains having a thickness that is equal to a thickness of the sublayer in which the magnetic grains are located.

18. A hard disk drive as described in claim 17 wherein said midlayer is comprised of a nonmagnetic material, and each said sublayer is comprised of a magnetic material.

19. A hard disk drive as described in claim 18 wherein said midlayer is comprised of Cr or Ta.

20. A hard disk drive as described in claim 18 wherein each said sublayer is comprised of CoThCr or CoPtCrTa.

21. A hard disk drive as described in claim 17 wherein a first said sublayer is disposed upon a seed layer.

22. A hard disk drive as described in claim 21 wherein said seed layer is composed of Cr.

23. A hard disk drive as described in claim 17 wherein each said sublayer is formed with a substantially equal thickness.

* * * * *